US006548833B1

United States Patent
Lin et al.

(12)

(10) Patent No.: US 6,548,833 B1
(45) Date of Patent: Apr. 15, 2003

(54) COLOR-OPTIMIZED PIXEL ARRAY DESIGN

(75) Inventors: Chi-Shao Sergi Lin, Santa Monica, CA (US); Bimal P. Mathur, Thousand Oaks, CA (US); Taichi Wang, Thousand Oaks, CA (US)

(73) Assignee: Biomorphic VLSI, Inc., Westlake Village, CA (US)

( * ) Notice: Subject to any disclaimer, the term of this patent is extended or adjusted under 35 U.S.C. 154(b) by 0 days.

(21) Appl. No.: 09/697,764

(22) Filed: Oct. 26, 2000

(51) Int. Cl.[7] .............................................. H01L 33/00
(52) U.S. Cl. ........................ 257/89; 257/232; 257/292; 257/294; 257/440
(58) Field of Search ......................... 257/89, 440, 232, 257/292, 294

(56) References Cited

U.S. PATENT DOCUMENTS

| 5,945,722 A | | 8/1999 | Tsuei et al. | ................. | 257/440 |
| 5,965,875 A | * | 10/1999 | Merrill | ....................... | 250/226 |
| 6,111,300 A | * | 8/2000 | Cao et al. | .................... | 257/440 |
| 6,150,683 A | * | 11/2000 | Merrill et al. | ............... | 257/292 |

FOREIGN PATENT DOCUMENTS

JP  2000261602 A  *  9/2000

* cited by examiner

*Primary Examiner*—Nathan J. Flynn
*Assistant Examiner*—Remmon R. Fordé
(74) *Attorney, Agent, or Firm*—Pillsbury Winthrop LLP (57) ABSTRACT

A color optimized CMOS photodiode pixel array is provided. The pixel array employs different dimensions to take advantage of different characteristics of the photodiode physics to produce an enhanced image while minimizing the need for post processing. The design includes a relatively shallow blue pixel photodiode, a deeper green pixel photodiode, and a relatively deep red pixel photodiode. The red pixel photodiode is larger and deeper than the green pixel photodiode, which is larger and deeper than the blue pixel photodiode. Each color pixel photodiode comprises a junction diode and a depletion region. The CMOS construction of the three color pixel photodiodes may vary, but one possible construct of the red pixel photodiode would be an N Well/P Sub diode construct, the green pixel photodiode a $N^+$/P Sub diode construct, and the blue being a $N^+$/P Well or $N^+$/P Sub diode construct.

18 Claims, 7 Drawing Sheets

COLOR-OPTIMIZED PIXEL ARRAY DESIGN

BACKGROUND OF THE INVENTION

1. Field of the Invention

The present invention relates generally to the art of CMOS photo detectors for acquiring images in devices such as video cameras or electronic still picture cameras, and specifically to the pixel array employed in such devices.

2. Description of the Related Art

More manufacturers have focused on using existing CMOS foundry facilities to manufacture imaging components used in image pickup devices, such as video cameras or electronic still cameras. The use of CMOS in manufacturing these devices results in relatively simple integration of the imager, signal processing circuits, and control circuitry on a single chip. The performance of CMOS photodetectors has certain shortcomings since the process was originally designed for transistors. In particular, the use of traditional CMOS technology in a photodetector device does not produce the type of performance necessary to produce high quality photo images.

Imager arrays are constructed using a single type pixel repeated over the image receiving surface. Each pixel is designed to accept, or "see," a single color, such as red, green, or blue. Each pixel has a construction identical to each other pixel, i.e. no difference exists between a red pixel, a blue pixel, or a green pixel. The three different color pixel regions produce unbalanced responsivity, or different electrical responses, for each of the three different colored regions. It has been observed that systems employing identical pixel design for three different colors to construct an imager produce an excess red response, which is undesirable. Further, the use of three different pixel regions having highly similar construction can suffer from cross coupling of the electrical signals transmitted by the individual areas. Most notably, blue and green pixels can have a tendency to pick up signals from red pixels.

It has further been observed that black and white images taken in blue light appear sharper than the same image taken in red light. Further, the use of three different color pixel regions having highly similar construction can suffer from low responsiveness and high crosstalk, to name two generally perceived problems. Crosstalk is the general interference between two electromagnetic signals. Low responsiveness results in inferior signal to noise performance, while high crosstalk between the signals reduces the overall sharpness of an image.

Various methods have been used to improve the collection efficiency and overall performance of imaging devices, including utilizing different thicknesses of oxide layers to cover the red, green, and blue components of the photodiodes. This covering of the photodiode using oxide layers does not prevent the cross coupling inherent in the design, and requires exacting deposition of oxide layers which can be both expensive and time consuming. These problems diminish the quality of the image ultimately rendered.

It is therefore an object of the current invention to provide a pixelated image sensing arrangement that takes advantage of current CMOS fabrication and foundry capabilities and results in an improved quality image over previously known methods and designs.

It is a further object of the current invention to provide a CMOS image sensing pixel array design that minimizes the crosscoupling or crosstalk between signals generated by the components and also minimizes the negative effects associated with the physical characteristics inherent in the red, green, and blue nodes of the photodiode.

It is still a further object of the current invention to provide a design having increased responsiveness to light energy received over previously known designs, and particularly an enhanced collection efficiency and a balanced response for the red, green, and blue colors of the photodetector.

It is yet a further object of the current invention to provide a CMOS photodiode design having minimal crosstalk or crosscoupling between the signals of the pixel color regions, and minimize degradation of the Modulation Transfer Function.

SUMMARY OF THE INVENTION

The present invention is a color optimized CMOS photodiode pixel array that employs different dimensions to take advantage of different characteristics of the photodiode physics to produce an enhanced image that reduces the need for post processing. The design includes a relatively shallow blue pixel photodiode, a deeper green pixel photodiode, and a relatively deep red pixel photodiode, where all dimensions are relative to one another. The red pixel photodiode is responsiveness adjusted and balanced to the need of the particular arrangement, such as by resizing the components of the pixel structure. The goal is to provide a pixel suited in responsiveness to the color, such as red, intended to be received by the pixel. In one proposed embodiment, the red pixel photodiode can be deeper than the green pixel photodiode, which can be deeper than the blue pixel photodiode. Each color pixel photodiode comprises a junction diode and a depletion region sufficiently wide to provide effective responsiveness. One potential embodiment has the red junction diode having a depletion region on the order of one half the total width of the red pixel depletion region, and the depth of the red depletion region is approximately equal to twice the depth of the red junction diode. Again, the wider the depletion region, the better it is for either the red, green, or blue pixel, as a wider depletion region improves responsiveness. The blue pixel junction diode may be on the order of one third the width of the entire depletion region, while the blue pixel depletion region may be on the order of three times the depth of the blue junction diode. The red pixel junction diode may be on the order of at least three times as large as the blue pixel junction. It is understood that different dimensions may be employed while still within the scope of the current invention such that the design takes advantage of optimal responsiveness characteristics and cross coupling effects for the fabricated photodiode structure. Note that the preferred construct of the diode structures includes deposition of the depletion region on a uniform doping level layer.

The green pixel photodiode may be formed in different manners. In the present invention, the green pixel design could be any form of design between the red and blue pixel designs, preferably closer to the blue pixel design. One potential embodiment of the green pixel photodiode employs a dual stage or dual level junction diode with a dual stage depletion region. The dual stage comprises a relatively wide and shallow upper region and a narrow and deep lower region. The combination of a wide upper region and a deep lower region minimize cross coupling effects and maximize responsiveness. The depletion region in this design essentially reflects the contours of the junction diode, with a relatively large depth in the lower depletion region. An alternate embodiment of the green pixel photodiode is an intermediate construct between the blue pixel photodiode and the red pixel photodiode. The design of green pixels tends to be dependent on the pixel layout, contemplated environment, and design characteristics. In all cases it should be noted that the green pixel design should minimize cross coupling effects while maximizing responsiveness.

The CMOS construction of the three color pixel photodiodes may vary, but one possible construct of the red pixel photodiode would be an N Well/P Sub diode construct, the green pixel photodiode a $N^+$/P Sub diode construct, and the blue being a $N^+$/P Well diode construct. Other CMOS fabrication processes may be used for each color pixel photodiode, but these represent types of designs available for constructing the invention disclosed herein.

These and other objects and advantages of the present invention will become apparent to those skilled in the art from the following detailed description of the invention and the accompanying drawings.

DETAILED DESCRIPTION OF THE INVENTION

Figure 1:
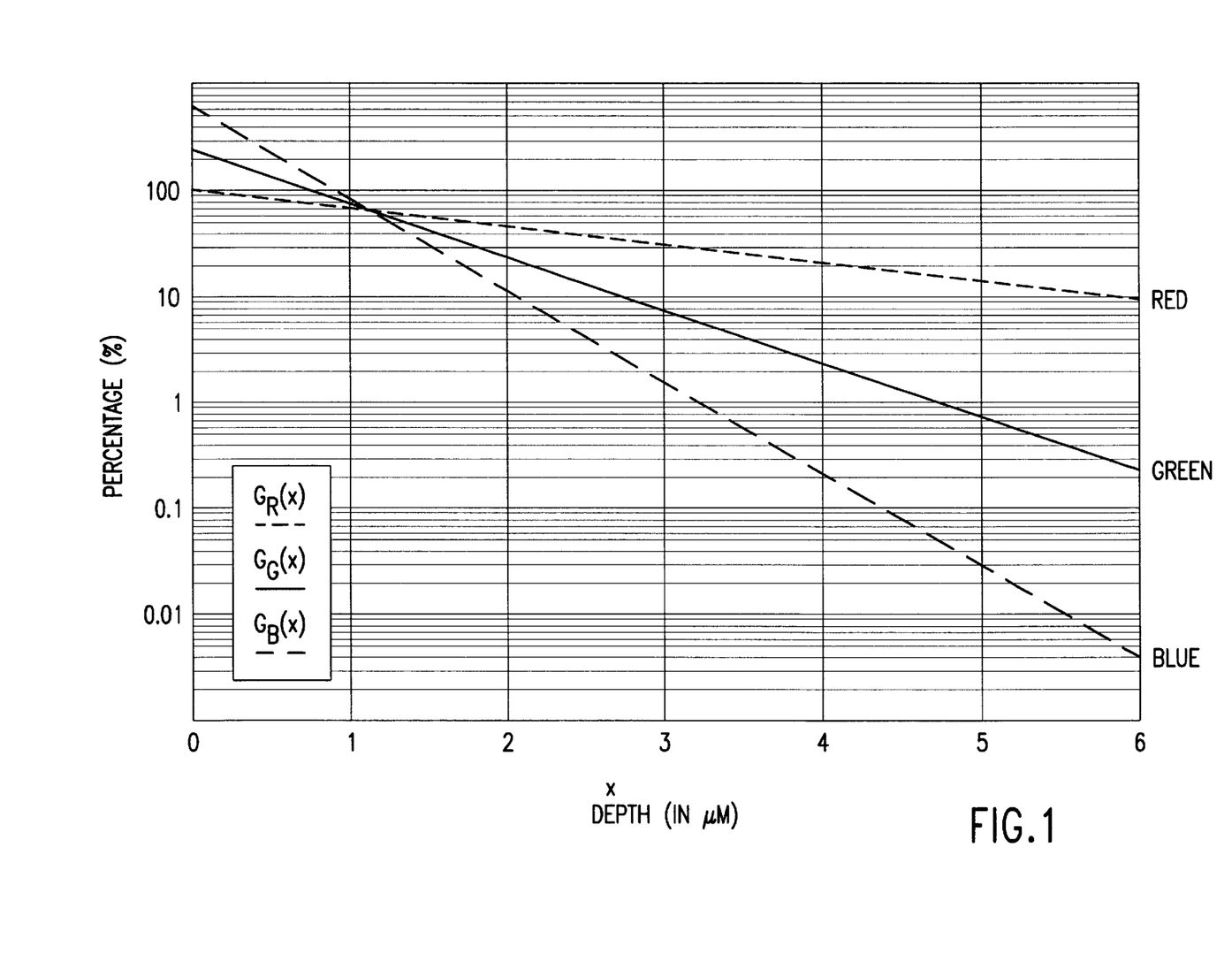
FIG. 1 illustrates a plot of decay of generation rates for three colors of light energy, with percentage of photogeneration plotted against depth of the diode.

An imager array is constructed using a single pixel repeated over the surface of the device. Each pixel is designed to receive or see only one color, red, green, or blue. It has been observed that photoelectron generation characteristics differ with different incident light wavelengths. In other words, the photoelectrons generated by red light differs from the photoelectrons generated by green light. FIG. 1 illustrates this effect, wherein the Blue photoelectron response has the highest surface photogeneration rate. The Blue photoelectron response also has the fastest decay rate for the colors red, green, and blue. This increased surface generation rate and accelerated decay rate implies that the blue pixel color region on the surface of the photodiode can operate more efficiently with a shallow junction depth to achieve higher responsivity. In other words, as blue responds rapidly and with a greater response at shallower depths, a shallow depth (as opposed to the depths required for other colors) will suffice. Conversely, from FIG. 1, the red pixel lighting will generate more electron carriers in the deeper regions. The deeper regions tend to enable more cross couplings. Thus a deeper junction will reduce the amount of carriers left in the region.

Figure 2:
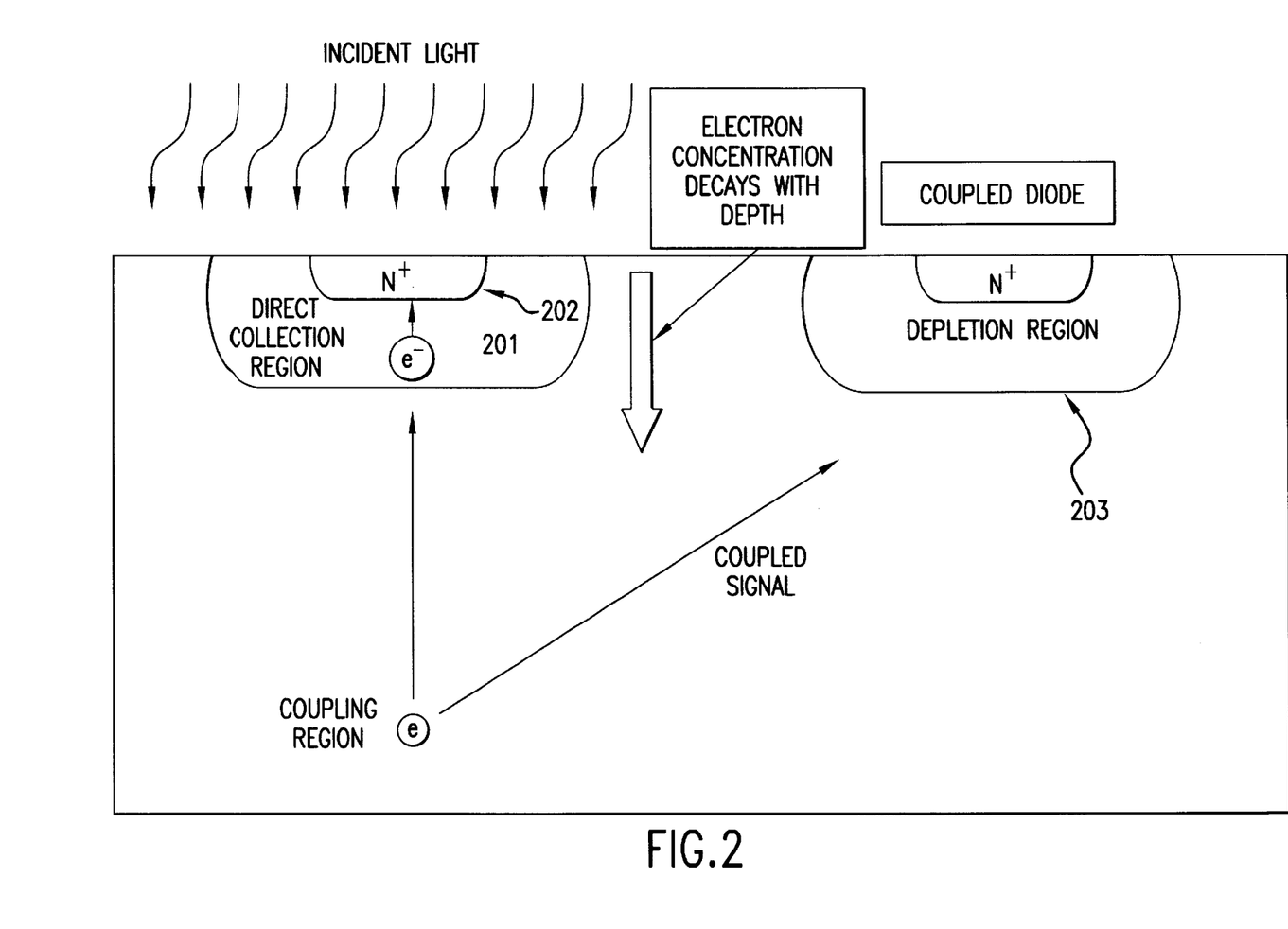
FIG. 2 presents the effects of cross coupling.

FIG. 2 illustrates the effects of cross coupling. Incident light is imparted onto the surface of the photodiode. Carrier electrons generated in the depletion region 201 are directly collected by the exposed diode 202. The electron concentration has a tendency to decay for occurrences deeper in the substrate, meaning fewer electrons exist deep in the substrate. However, for those carrier electrons present deep within the substrate, such electrons may migrate and be collected by a nearby diode 203. This effect is undesirable.

Figure 3:
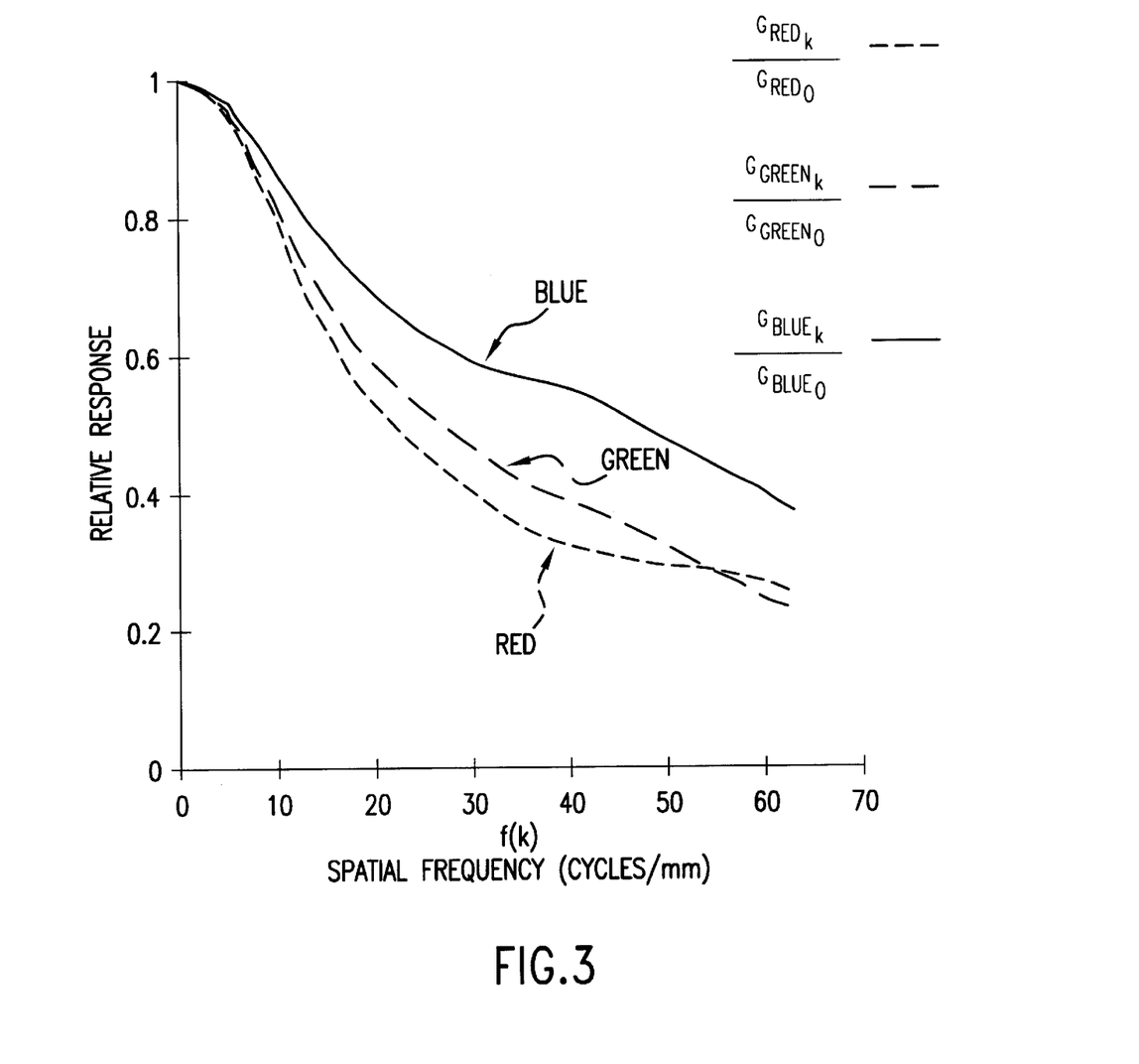
FIG. 3 is a plot of the modulation transfer function (MTF) of an imager in a typical photodiode, measured under red, green, and blue light sources.

One key measure of the performance of the photodiode pixel regions is the modulation transfer function, or MTF. An imager for a typical photodiode has a graph of MTF as shown in FIG. 3, measured under red, green, and blue light sources. The left side of the graph represents the relative response, or transfer function, for red (630 nm), green (525 nm) and blue (460 nm) light sources. The bottom line represents the spatial frequency in cycles per mm. From FIG. 3, the red MTF decays the fastest, followed by the green, and then the blue. This decay indicates that a deeper junction is desirable for a higher MTF at higher spatial frequencies, indicating better overall resolution for the imager. As the junction depth of the photodiode increases, the collection efficiency drops.

Figure 4:
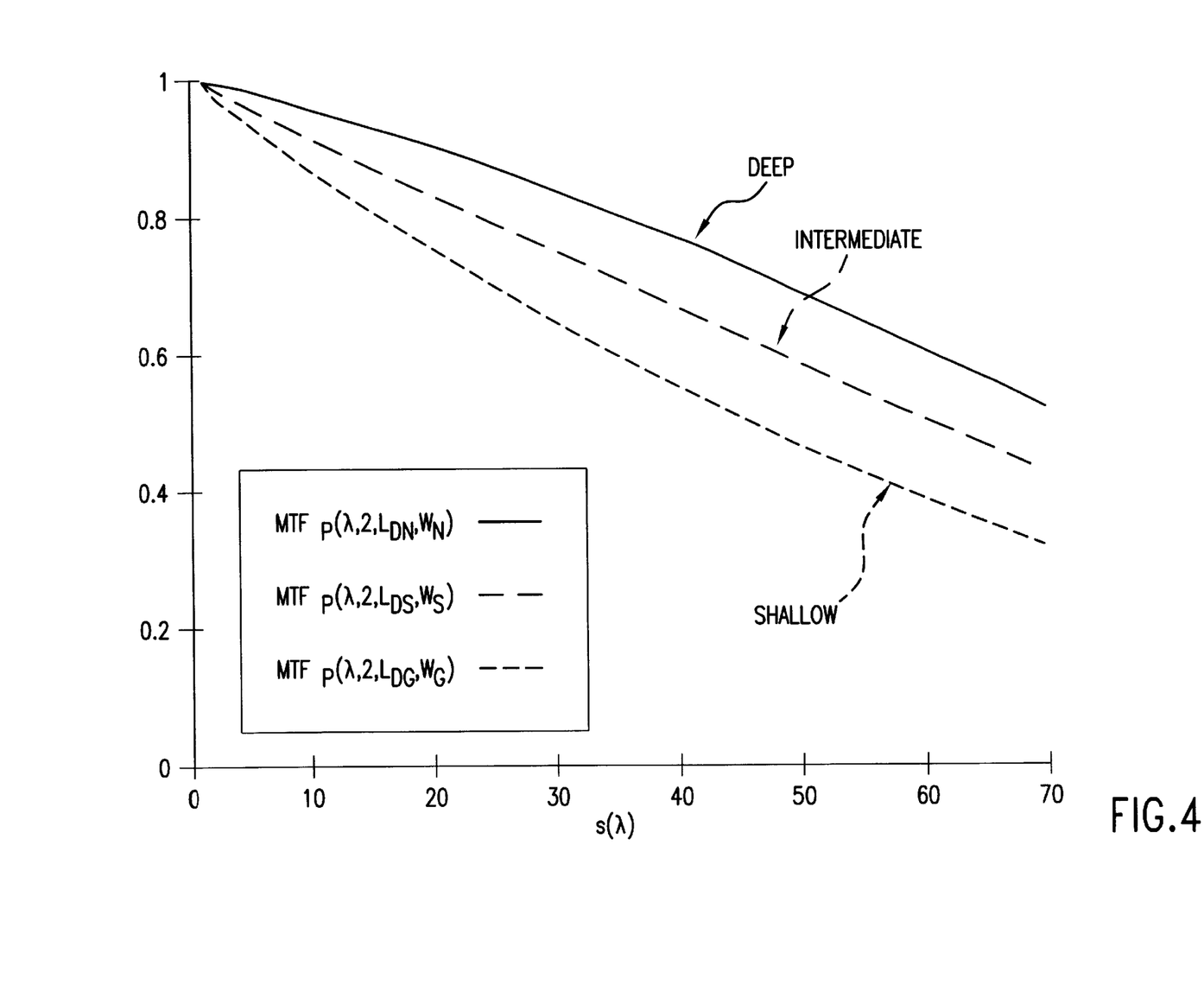
FIG. 4 illustrates the behavior of the MTF under red light for different junction depths, indicating a deeper junction is desirable to produce a higher MTF at higher spatial frequencies.

FIG. 4 represents a simulation of the MTF for red light with varying junction depths. The solid line represents the greatest junction depth, while the short dashed lines represent the shallowest depth. The graph contrasts the MTF versus spatial frequency. From FIG. 4, a deeper junction produces a higher MTF at a higher spatial frequency. This effect is desirable in that it produces a better resolution for the imager for the color red. This is contrary to the effects shown in the other drawings for the color blue. For the color blue, as the depth of the photodiode increases, the collection efficiency for the blue light generated carriers decreases. Thus there is no optimal junction depth that promotes collection for all three colors red, green, and blue.

A device employing an identical pixel structure for each of the three color components red, green, and blue, will produce unbalanced responses for each color region. From FIG. 1, the electron hole pair generation rate and absorption depth differ for each of the three colors. Color filters placed on top of the pixel regions will permit different percentages of light power and bandwidth to pass through. Any lenses and filters to be integrated with the imager as a complete system also affect the power density spectrum. The reflectivity of different colors to each layer of the pixel, such as the silicon layer, has different optical or electrical properties, and different light sources have different power density spectrums. Each of these factors contribute to the unbalanced response for the different color pixels and produce different output levels for each color region. When the colors are reconstructed, incorrect colors can result. Certain techniques to balance the response have been employed by multiplying or otherwise filtering the colors with different factors using circuitry or software. These post processing methods may cause noise and degrade the signal to noise ratio. The result is that the pixels are not used to their maximum SNR and dynamic range capability.

Figure 5:
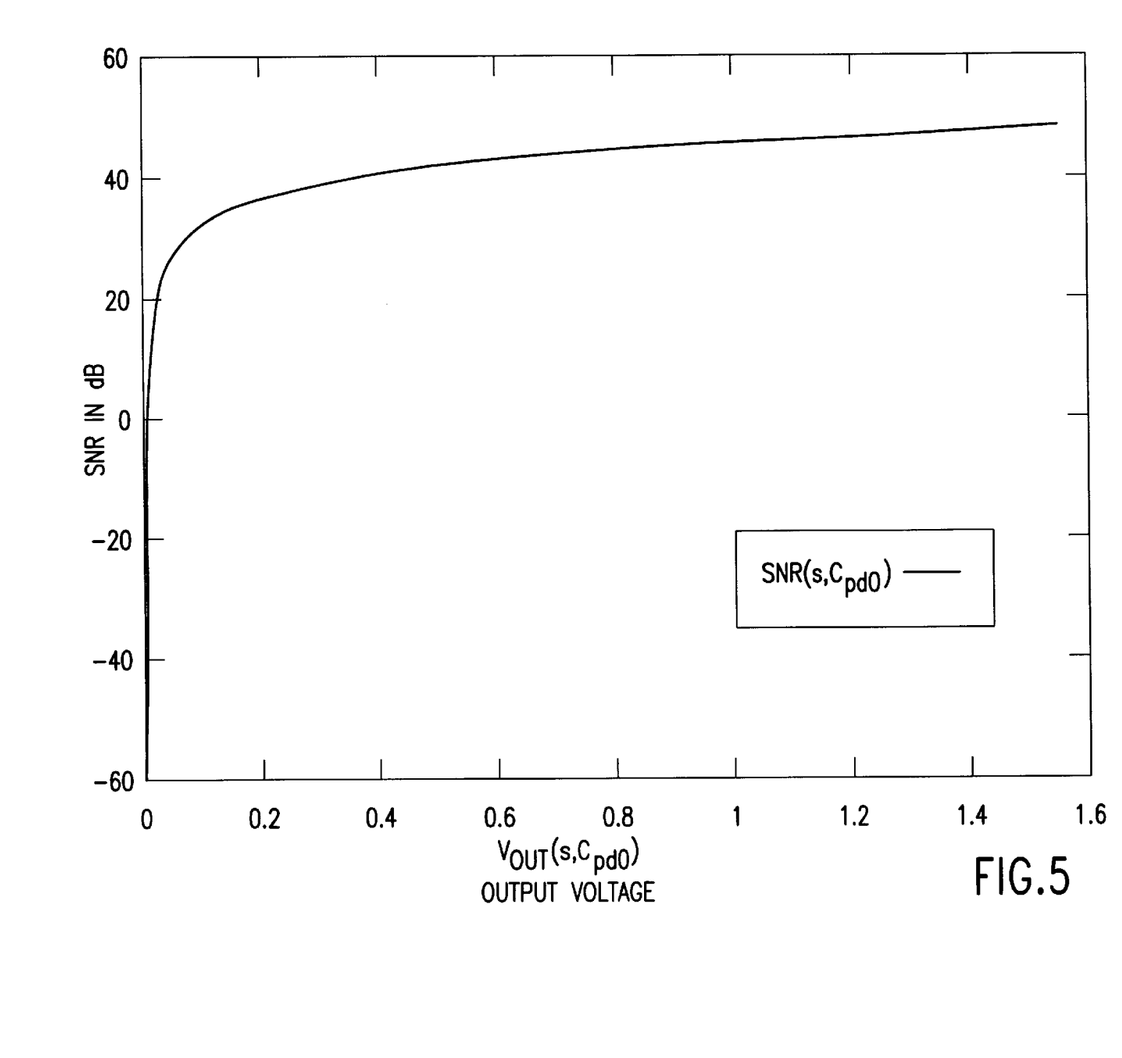
FIG. 5 shows a plot of Signal to Noise Ratio versus output level for a typical photodetector.

With respect to signal to noise ratios for photo detectors, FIG. 5 illustrates a typical SNR for detectors having different responsivity versus collected photo current. FIG. 5 illustrates a plot of SNR in dB versus the output level of the photodetector. The SNR improves with higher output levels, indicating that for a given collected photo current, a higher responsivity gives a better SNR. An imager array having balanced RGB responses enable the red, green, and blue pixels to reach their highest output level, yielding enhanced SNR performance. Balanced responses between the three colors also provide more accurate color appearance by reducing the need for white balancing for the circuitry and signal processing stage.

Maximum responsivity of a photodiode requires a shallow junction and a wide depletion region. A wide depletion region benefits from a lighter background doping level. Cross coupling is minimized by using a deep junction diode to minimize the number of carriers left outside the diode depletion region (the deeper area of the diode). This prevents the junction from being the source of cross coupling. A shallow junction diode minimizes the collection of the coupled signal, thereby preventing the junction from encountering and being adversely affected by cross coupling. An increase in background doping decreases the minority carrier lifetime, thereby minimizing cross coupling effects. Finally, cross coupling is minimized by creating a descending doping level toward the deeper regions of the diode to produce a retarding electric field in opposition to the collection of the diffusion component. The diffusion component is the only mechanism of the coupled signal.

Certain aspects of these photodiode enhancements are contradictory. For example, creation of a shallow junction to improve responsivity contradicts the creation of a deep junction to minimize cross coupling effects. However, depending on the color of the pixels and the effects observed for each color, a specific set of priorities for fabrication exists. For a red pixel, the highest priority is to prevent the pixel from acting as a coupling source, which is assisted by using a deeper junction diode. The second priority is the pixel receiving signals and suffering the effects of cross coupling. The lowest priority is the overall responsiveness of the pixel, as red tends to be the most responsive color pixel for increasing depth from FIG. 1. For blue pixels, the highest priority is improving responsiveness of the pixel, as shown by the dropoff for blue in FIG. 1. The second most important criterion is the diode receiving signals from another junction and becoming a victim of cross coupling. The third most important criteria is that the junction itself will be a source of coupling. For green pixels, the priority for each aspect of responsiveness and acting as a coupling source or receiving coupling signals depends on the pixel layout, and as seen in the Figures is not as extreme as the effects of red and blue. Thus for a red pixel, a deeper junction diode prevents the diode from becoming a coupling source, while a wider and deeper depletion area decreases the amount of carriers able to become a coupled signal and thus a source of coupling. For blue pixels, a shallow junction diode increases the responsiveness of the junction, while a moderate depletion width balances the tradeoff between responsiveness and effects due to cross coupling.

Figure 6:
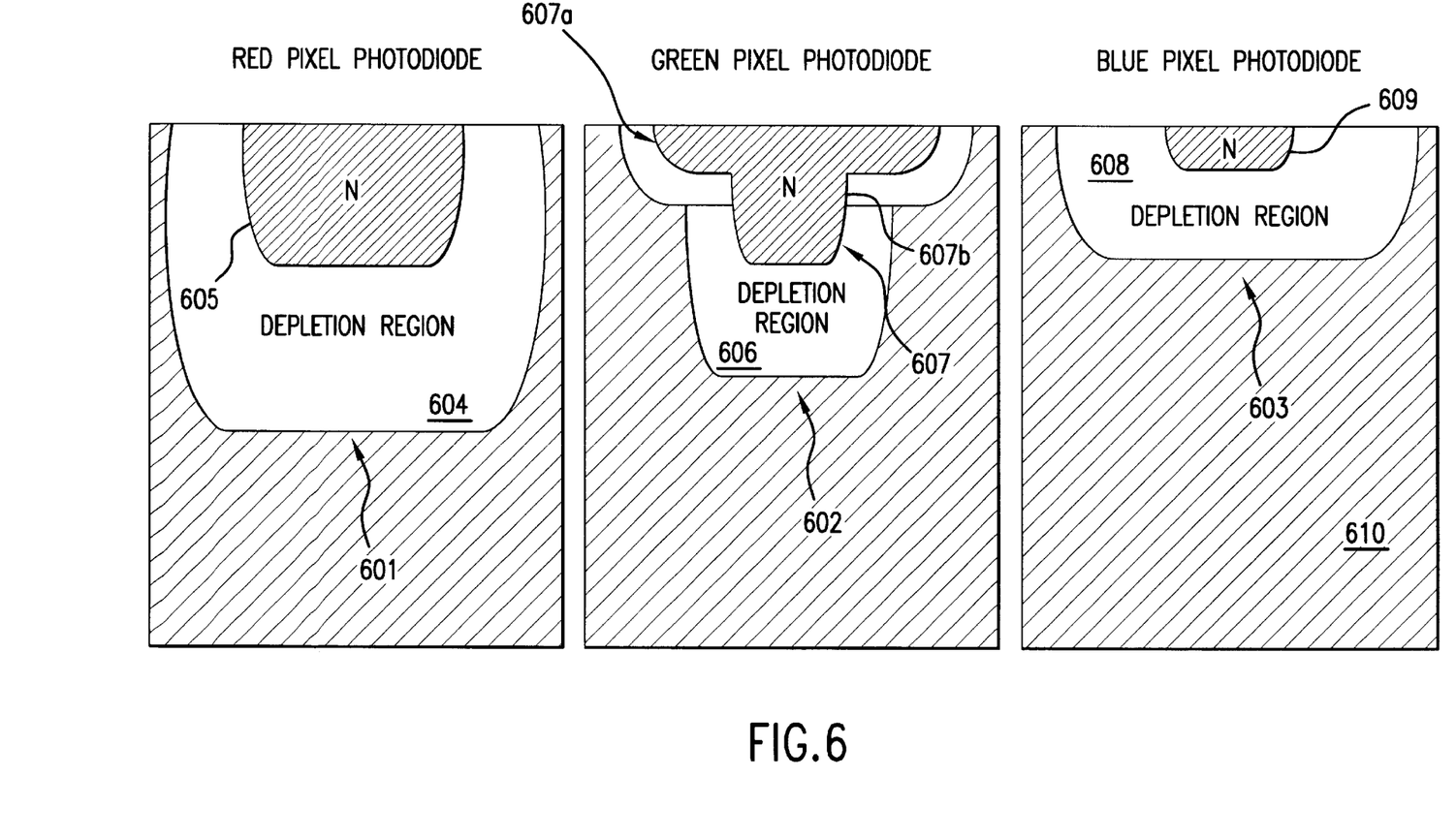
FIG. 6 illustrates one embodiment of the invention disclosed herein.

FIG. 6 illustrates side profiles of a preferred embodiment utilizing the concepts discussed above. The red pixel photodiode 601 comprises a relatively deep depletion region 604 and a relatively deep junction diode 605 to produce beneficial results. As may be appreciated by those of skill in the art, the deeper the depletion region the better the responsiveness of the pixel, within limits. And the improved responsiveness is best for the red pixel for the reasons presented above. As can be seen from FIG. 6, the depth of the junction diode 605 is dimensionally on the order of the width of the junction diode 605. The depletion region 604 is approximately as wide as twice the width of the junction diode 605. The depth of the depletion region 604 is roughly twice the depth of the junction diode 605. Different dimensions may be employed while still within the scope of the current invention. However, the relative dimensions of the red pixel photodiode (deeper junction diode, deeper depletion region) with respect to the blue pixel photodiode should be maintained. The blue pixel photodiode 603 includes a relatively shallow junction diode 609 with a relatively small depletion region 608. From FIG. 6, the width of the junction diode 609 is less than that of the red pixel junction diode, and the width of the blue pixel photodiode depletion region 608 is approximately three times the width of the junction diode 609. The depth of the blue pixel photodiode depletion region is approximately three times the depth of the junction diode 609, or 1.5 times the width of the junction diode 609. Compared with the red pixel photodiode, the blue pixel photodiode has a junction less than half the size of the red pixel photodiode and a depletion region less than half the size of the red pixel photodiode depletion region. Again, these dimensions are approximate, but the relative differences between the red and blue pixel photodiodes should be roughly maintained. In particular, the dimensions of the red pixel components should be larger than those of the blue pixel components.

Figure 7:
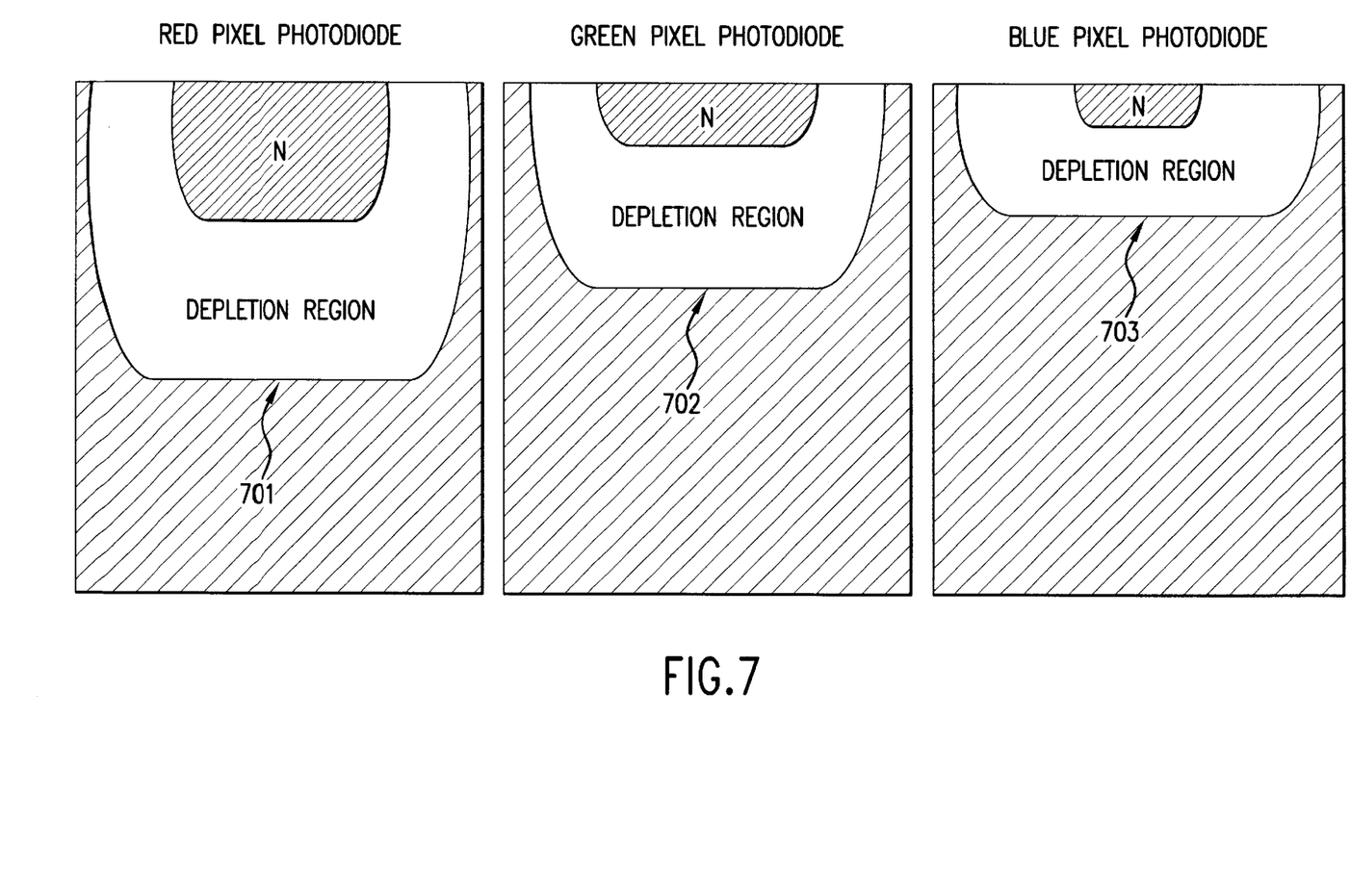
FIG. 7 presents a second embodiment of the invention disclosed herein.

The green pixel photodiode 602 has a two stage junction diode 607 including a wide upper portion 607a and a relatively narrow lower portion 607b. The green pixel photodiode has a relatively small depletion region 606 that generally conforms to the shape of the junction. The dual stage junction diode 607 provides increased responsiveness at the edges with a deep lower stage to decrease cross coupling concerns. An alternate construct of the green pixel photodiode is illustrated in FIG. 7, where red pixel photodiode 701 and blue pixel photodiode 703 are dimensionally larger and smaller, respectively, than the green pixel photodiode 702. It should be noted that each color pixel photodiode in FIGS. 6 and 7 includes a constant doping level 610 and 710. Note also that spacing between the pixels is similar to that previously employed in CMOS photodiode design, but is to an extent dependent on the precise layout of the pixels.

The preferred embodiments of the diode structures illustrated in FIGS. 6 and 7 are constructed using the CMOS process. The intermediate depth green pixel photodiode 702 may be an $N^+$/P Sub diode, with the increased depth red pixel photodiode 701 being an N Well/P Sub diode, and the blue pixel photodiode 703 may be an $N^+$/P well diode. Certain cases or environments may use different combinations of the three types of diodes, and can depend on the responsiveness and cross coupling of the photodiode and junction and certain layout limitations.

One possible layout arrangement is four pixels lined up in a quadrant, including two green pixels, one red pixel, and one blue pixel within the quadrant. For example, the upper left quadrant may be a red pixel constructed according to the description provided above, the lower right quadrant a blue pixel constructed in accordance with the design above, and the other two quadrants (lower left and upper right quadrants) having green pixels constructed as described above.

It should be noted that an IR-cut filter can be employed within the system. If such an IR-cut filter is used and the junction depth of the red pixel photodiode is sufficient so as not to leave too many photo-generated carriers in the deeper region, the depletion regions of all three different color pixel photodiodes will all be better if they are wider. This is particularly true because photo-generated carriers in the deeper region are the main source of cross talk, and the use of wider depletion regions tend to decrease the amount of crosstalk.

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A CMOS photodiode, comprising:
   a red pixel photodiode section comprising a red junction diode having a first dimension and a red depletion region having a second dimension;
   a blue pixel photodiode section having a blue junction diode region having a third dimension and a blue depletion region having a fourth dimension; and
   a green pixel photodiode section;
   wherein said red first dimension is greater than said third dimension and said second dimension is greater than said fourth dimension.

2. The CMOS photodiode of claim 1, wherein said green pixel photodiode section comprises a green junction diode having a fifth dimension, and a green depletion region having a sixth dimension, and wherein:
   said first dimension is greater than said fifth dimension which is greater than said third dimension; and
   said second dimension is greater than said sixth dimension which is greater than said fourth dimension.

3. The CMOS photodiode of claim 1, further comprising a constant doping level layer proximate each depletion region.

4. The CMOS photodiode of claim 1, wherein said red pixel photodiode section comprises an N well/P sub diode.

5. The CMOS photodiode of claim 1, wherein said blue pixel photodiode section comprises an $N^+$/P Sub diode.

6. The CMOS photodiode of claim 1, wherein said green pixel photodiode section comprises an $N^+$/P sub diode.

7. A CMOS photodiode, comprising:
   a red pixel photodiode section comprising a red junction diode having a first dimension and a red depletion region having a second dimension;
   a blue pixel photodiode section having a blue junction diode region having a third dimension and a blue depletion region having a fourth dimension; and
   a green pixel photodiode section;
   wherein said red first dimension is greater than said third dimension and said second dimension is greater than said fourth dimension, and said green pixel photodiode comprises a two layer junction diode comprising an upper layer and a lower layer, and a dual level depletion region comprising an upper region and a lower region.

8. The CMOS photodiode of claim 7, wherein said upper layer increases the responsiveness of the photodiode while said lower layer prevents coupling effects.

9. A set of CMOS photodiode pixel regions, comprising:
   a red pixel region, comprising a red junction diode and a red depletion region;
   a green pixel region, comprising a green junction diode and a green depletion region; and
   a blue pixel region, comprising a blue junction diode and a blue depletion region;
   wherein said red junction diode is larger than said blue junction diode, and said red depletion region is larger than said blue depletion region.

10. The set of CMOS photodiode pixels of claim 9, wherein:
    the green junction diode has dimensions smaller than the red junction diode and larger than or equal to the blue junction diode; and
    the green depletion region has dimensions smaller than the red depletion region and larger than the blue depletion region.

11. The set of CMOS photodiode pixels of claim 9, further comprising a constant doping level layer proximate each depletion region.

12. The set of CMOS photodiode pixels of claim 9, wherein:
    said red pixel photodiode comprises an N well/P sub diode;
    said blue pixel photodiode comprises an $N^+$/P Well diode; and
    said green pixel photodiode comprises an $N^+$/P sub diode.

13. A set of CMOS photodiode pixel regions, comprising:
    a red pixel region, comprising a red junction diode and a red depletion region;
    a green pixel region, comprising a green junction diode and a green depletion region; and
    a blue pixel region, comprising a blue junction diode and a blue depletion region;
    wherein said red junction diode is larger than said blue junction diode, and said red depletion region is larger than said blue depletion region, and said green pixel photodiode comprises a two layer junction diode comprising an upper layer and a lower layer, and a dual level depletion region comprising an upper region and a lower region.

14. The set of CMOS photodiode pixels of claim 13, wherein said upper layer increases the responsiveness of the photodiode while said lower layer prevents coupling effects.

15. A photodiode structure, comprising:
    a blue relatively shallow pixel photodiode region;
    a green relatively intermediate depth pixel photodiode region; and
    a red relatively deep pixel photodiode region;
    wherein said red photodiode region is deeper than said green photodiode region, and said green photodiode region is deeper than said blue photodiode region, and said green pixel photodiode region comprises a green junction diode and a green depletion region, said red pixel photodiode region comprises a red junction diode and a red depletion region, and wherein said red depletion region is larger than said green depletion region, and said green depletion region is larger than a blue depletion region.

16. The photodiode structure of claim 15, further comprising a constant doping level layer proximate each depletion region.

17. A photodiode structure, comprising:
    a blue relatively shallow pixel photodiode region;
    a green relatively intermediate depth pixel photodiode region; and
    a red relatively deep pixel photodiode region;
    wherein said red photodiode region is deeper than said green photodiode region, and said green photodiode region is deeper than said blue photodiode region, and said green pixel photodiode region comprises a two layer junction diode comprising an upper layer and a lower layer, and a dual level depletion region comprising an upper region and a lower region.

18. The photodiode structure of claim 17, wherein said upper layer increases the responsiveness of the photodiode while said lower layer prevents coupling effects.

* * * * *